(12) United States Patent
Lutwak et al.

(10) Patent No.: US 6,605,849 B1
(45) Date of Patent: Aug. 12, 2003

(54) MEMS ANALOG FREQUENCY DIVIDER

(75) Inventors: Robert Lutwak, Marblehead, MA (US); William J. Riley, Jr., Hamilton, MA (US); Kenneth D. Lyon, Wilmington, MA (US)

(73) Assignee: Symmetricom, Inc., Beverly, MA (US)

( * ) Notice: Subject to any disclaimer, the term of this patent is extended or adjusted under 35 U.S.C. 154(b) by 0 days.

(21) Appl. No.: 10/077,031

(22) Filed: Feb. 14, 2002

(51) Int. Cl.[7] .......................... H01L 29/84; H01L 29/86
(52) U.S. Cl. ........................................ 257/415; 257/416
(58) Field of Search ................................. 257/419, 416

(56) References Cited

U.S. PATENT DOCUMENTS

| | | |
|---|---|---|
| 4,446,446 A | 5/1984 | Fowks |
| 4,476,445 A | 10/1984 | Riley, Jr. |
| 4,943,955 A | 7/1990 | Rabian et al. |
| 5,146,184 A | 9/1992 | Cutler |
| 5,369,862 A * | 12/1994 | Kotani et al. ............... 29/25.35 |
| 5,412,265 A | 5/1995 | Sickafus |
| 5,657,340 A | 8/1997 | Camparo et al. |
| 5,729,075 A | 3/1998 | Strain |
| 5,767,405 A | 6/1998 | Bernstein et al. |
| 5,956,292 A | 9/1999 | Bernstein |
| 6,028,389 A | 2/2000 | Bernstein |
| 6,094,102 A | 7/2000 | Chang et al. |
| 6,103,072 A | 8/2000 | Nishiwaki et al. |
| 6,157,261 A | 12/2000 | Audoin et al. |
| 6,262,464 B1 | 7/2001 | Chan et al. |
| 6,271,619 B1 | 8/2001 | Yamada et al. |
| 6,284,434 B1 | 9/2001 | Kamei et al. |
| 6,291,927 B1 * | 9/2001 | Percin et al. ............... 310/324 |
| 6,453,744 B2 * | 9/2002 | Williams .................. 73/504.12 |
| 6,462,858 B1 * | 10/2002 | MacDonald et al. ........ 359/290 |

* cited by examiner

*Primary Examiner*—Allan R. Wilson
(74) *Attorney, Agent, or Firm*—Thomas J. Engellenner; Reza Mollaaghababa; Nutter McClennen & Fish LLP (57) ABSTRACT

The present invention provides an analog frequency divider structure that receives an input signal at a selected frequency and generates an output signal at a fraction, e.g. one-half, of the input frequency. In one embodiment, the analog frequency divider structure is implemented as a MEMS device having a vibratory beam extending along a longitudinal axis between two fixed ends and a piezoelectric transducer coupled to the beam. The MEMS structure further includes a conductive layer disposed on at least a portion of the vibratory beam, which is capacitively coupled to a conductive electrode. A longitudinal excitation of the piezoelectric transducer can effect application of a periodic longitudinal deformation force to the vibratory beam. This deformation force causes the beam to vibrate in a transverse direction at its natural transverse vibrational frequency, which is selected to be a fraction of the input frequency. The conductive electrode capacitively couples to this transverse vibration to generate an output electrical signal at the transverse vibrational frequency.

21 Claims, 11 Drawing Sheets

MEMS ANALOG FREQUENCY DIVIDER

BACKGROUND OF THE INVENTION

The present invention relates generally to parametric frequency divider structures and more particularly to analog frequency dividers that can be implemented as micro-electro-mechanical systems (MEMS).

Frequency multiplication, division, and mixing are signal processing techniques which are utilized in a wide array of devices including electronic, optical, and opto-electronic devices. MEMS structures are emerging as an important technology for manufacturing devices that perform signal processing. For example, U.S. Pat. No. 6,262,464 B1 describes a MEMS device that can be utilized for signal mixing and filtering.

Devices for performing frequency division, e.g., high-speed GaAs digital frequency dividers, are also known. Such conventional digital frequency dividers however, typically require high power for operation, and hence are not particularly suitable for a variety of applications such as chip-scale atomic clocks, miniature radio frequency (RF) receivers and transceivers, and other battery-operated, portable wireless devices.

Accordingly, there is a need for frequency dividers that can operate on low power. Further, there is a need for such frequency dividers that are sufficiently small to be suitable for incorporation in small-scale devices, especially portable communication and navigation devices incorporating RF synthesis and time references.

SUMMARY OF THE INVENTION

The present invention provides an analog mechanical parametric frequency divider structure that functions as an injection-locked parametric resonator which can be driven by an input signal at a selected frequency in a manner that a parameter of the resonator is varied so as to generate a coherent oscillation at a fraction of the input frequency as an output signal. For example, the resonator parameter that is varied can be the length of a micro-mechanical oscillatory beam such that flexural motion of the beam occurs at a sub-multiple of the driving input frequency.

In one embodiment, a parametric frequency divider structure according to the invention includes a vibratory beam with a longitudinal axis that extends between two ends, at least one of which is fixed. The divider structure further includes a piezoelectric transducer that is mechanically coupled to the vibratory beam and periodically applies a longitudinal deformation force, i.e. a longitudinal expansion or compression force to the beam. This periodic longitudinal deformation force induces a periodic vibration in the beam in a direction transverse to the longitudinal axis (a bowing or swaging of the beam) at a frequency that is substantially equal to an even sub-multiple, e.g. one-half, of the longitudinal frequency.

In a related aspect, the vibratory beam exhibits a natural vibrational resonance in the transverse direction at a frequency that is substantially equal to an even sub-multiple of the frequency of the longitudinal deformation force. This facilitates inducing a transverse vibration in the beam at the transverse resonance frequency, an even sub-harmonic of the frequency of the longitudinal deformation force. Because of the frequency-dividing properties of the present invention, such structures are particularly useful in electronic signal processing.

For example, in one embodiment, an analog frequency divider is disclosed based on a structure according to the invention, which further includes an electrically conductive layer disposed on at least a portion of the vibratory beam and a conductive electrode that is positioned in proximity of the conductive layer. The electrode couples capacitively to the periodic vibration of the beam to generate an oscillatory electrical signal at the transverse vibrational frequency.

In a further aspect, the vibratory beam can include two surfaces, which extend along the transverse direction on opposite sides of the beam (e.g., on the top and the bottom of the beam), and the piezoelectric transducer can be implemented as a piezoelectrically active film that covers at least a portion of one of the opposing beam surfaces. An oscillator generating a periodic voltage at a selected frequency can be coupled to the piezoelectric film to cause a change in the length and/or effect a longitudinal deformation of the piezoelectric film. The deformation of the film, as a result of the mechanical coupling of the film to the vibratory beam, in turn induces longitudinal deformation of the beam.

An analog frequency divider structure according to the teachings of the invention can be implemented as a micro-electro-mechanical systems (MEMS) device formed, for example, in an integrated circuit chip or wafer. In a MEMS frequency divider of the invention, the vibratory beam can be formed of an insulating material, such as $Si_3N_4$. Further, the conductive layer, which covers at least a portion of the beam, can be formed of $Si_2Co$. In such a MEMS device, the conductive electrode, which couples capacitively to the beam, can be formed from a metal, such as, platinum, tungsten, gold or copper.

In further aspects, the invention provides a MEMS cascade chain of analog frequency divider structures, as described above, that are coupled to one another in a series arrangement. The first member of the chain receives an input signal at a selected frequency and the last member of the chain generates an output signal at a fraction of the input frequency. The output of each member, other than the last member, provides an input signal for the next member in the chain. Each member exhibits a transverse vibrational resonance at a frequency that is a fraction of the corresponding resonance frequency of a previous member in the chain. Thus, each member divides the output frequency of a previous neighboring member by a selected fraction to generate the final output frequency. For example, in one embodiment, each frequency divider in the chain divides the output frequency of a previous divider by 2. The members of the chain can be directly coupled to one another, or alternatively, one or more gain stages may be employed between the chain members.

The analog frequency dividers of the invention can find a wide range of applications. Such applications can include, but are not limited to, radio systems (e.g., wireless communication devices), and miniature atomic clocks. For example, an atomic clock system according to the teachings of the invention can include an atomic vapor, such as cesium and a microwave oscillator that generates radiation selected to be in a range suitable for exciting an atomic transition. The atomic clock system further includes a feedback system for monitoring the response of the atoms to the radiation. The feedback system is coupled to the oscillator and applies a feedback signal thereto based on the monitored response, in order to stabilize the oscillator frequency. One or more MEMS analog dividers, such as the divider described herein, can receive a portion of the oscillator radiation at the stabilized frequency as an input signal and generate an output signal at a fraction of the oscillator frequency. This output signal of the MEMS divider (or cascading series of dividers) is preferably in a range, e.g., a few megahertz, that is useful as a clock frequency having a stability and an accuracy commensurate with those of the atomic transition.

Another example of an application for a MEMS analog frequency divider according to the invention is in a frequency synthesizer, such as those utilized in a radio receivers or transceivers, where a low-power frequency divider is needed to prescale a local oscillator to a lower frequency for further processing by digital logic.

The following embodiments, described with reference to the following drawings, provide further understanding of the invention.

BRIEF DESCRIPTION OF THE DRAWINGS

FIGS. 7A–7D are top views of the substrate of FIG. 3 schematically illustrating a number of manufacturing steps that follow the steps depicted in FIGS. 4–6, FIGS. 8–10 are cross-sectional views of the substrate of FIG. 3 schematically illustrating the manufacturing steps that follow those illustrated by FIGS. 7A–7D, FIG. 11 schematically illustrates another embodiment of an analog frequency divider in accordance with the teachings of the invention, FIG. 12 schematically illustrates a MEMS parametric frequency divider structure according to the teachings of the invention having a vibratory beam, among other elements, that is clamped at only one end thereof, FIG. 13 schematically illustrates one exemplary application of a MEMS divider according to the teachings of the invention for prescaling the output of a microwave oscillator to radio frequency range, FIG. 14A schematically illustrates a conventional radio frequency receiver, FIG. 14B schematically illustrates a radio frequency receiver in which a MEMS divider according to the teachings of the invention is utilized for frequency division.

DETAILED DESCRIPTION

The present invention provides an analog frequency divider structure that functions as an injection-locked parametric oscillator. The analog frequency divider receives an input signal at a selected frequency and generates an output signal at a fraction of the input frequency. An analog frequency divider structure of the invention is preferably implemented as a micro-electro-mechanical systems (MEMS) device that requires low power for operation and is sufficiently small to be incorporated in miniature systems, such as a miniature atomic clock or portable wireless devices.

Figure 1:
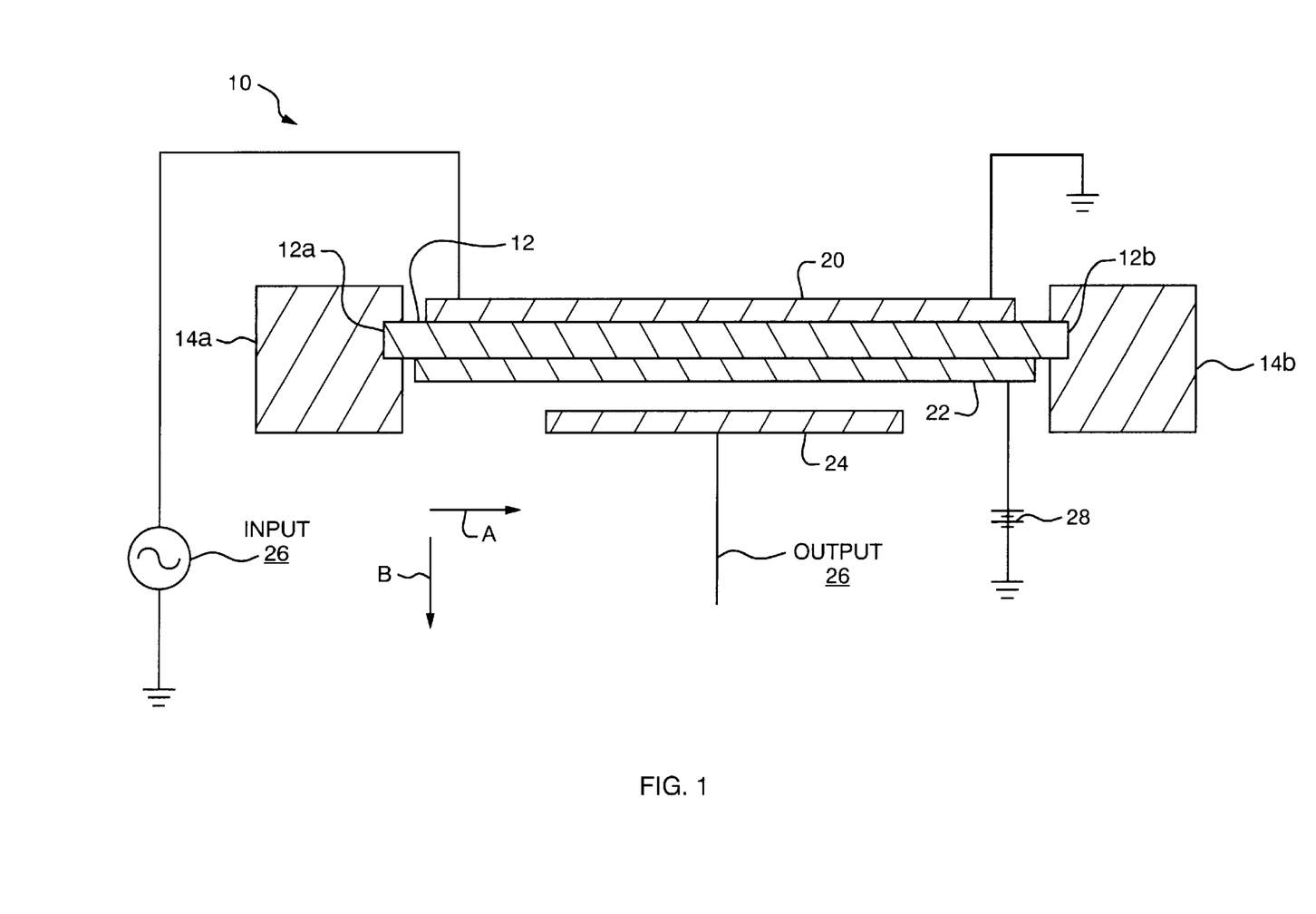
FIG. 1 schematically illustrates an analog frequency divider in accordance with the teachings of the invention.
Figure 2:
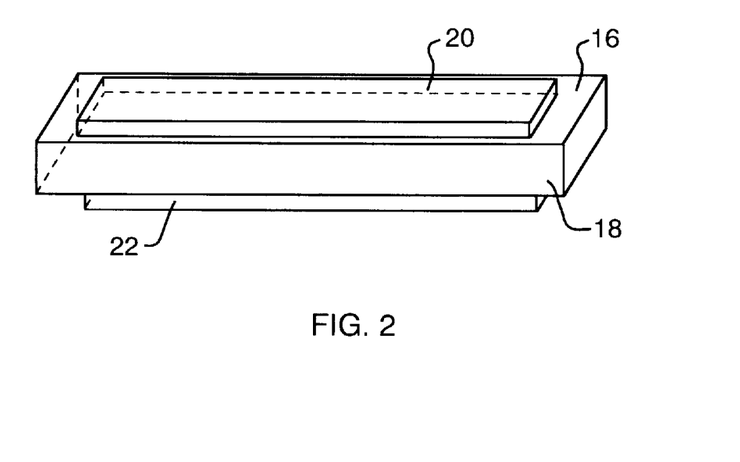
FIG. 2 is a perspective view of the vibratory beam of the divider of FIG. 1 with a piezoelectric transducer coupled to one surface of the beam and a conductive layer covering at least a portion of an opposed surface.

With reference to FIGS. 1 and 2, an analog frequency divider structure 10 according to the teachings of the invention includes a vibratory beam 12 extending along a longitudinal axis (A) between two ends 12a, 12b thereof. Two support elements 14a and 14b clamp the beam 12 at its two ends 12a and 12b, respectively, such that, while fixed at its two ends, the beam can flex in a direction, herein designated as direction B, that is transverse to the longitudinal axis A. The vibratory beam 12 further includes two surfaces 16 and 18 that face one another along the transverse direction B. A piezoelectric transducer 20 is mechanically coupled to the surface 16, and a conductive layer 22 covers at least a portion of the surface 18. The term "piezoelectric transducer," as used herein, is intended to refer not only to an element formed of a piezoelectric material but also an element formed of ferroelectric or electrostrictive materials having similar functions, or more broadly, of any material that responds to an applied electric field by changing its shape and/or responds to stress to produce electrical charge. In one embodiment, the transducer 20 includes a piezoelectrically active film that is deposited over at least a portion, and more preferably, the entire area of the surface 16. The exemplary divider structure 10 further includes a conductive electrode 24 positioned in proximity of the conductive layer 22 for capacitive coupling with the vibratory beam 12.

The divider structure 10 can be utilized to generate a periodic output signal at a frequency that is substantially equal to an even sub-multiple of the frequency of a periodic input signal applied to the piezoelectric transducer 20 in a manner described below. More particularly, a voltage source 26 that generates an electrical signal at a selected frequency (f) can be coupled to the piezoelectric film 20 so as to apply a periodic input voltage at the oscillator frequency (f) to the piezoelectric film 20 along the longitudinal axis A. The applied oscillatory voltage effects a periodic modulation in the length of and/or applies a longitudinal deformation force to the piezoelectric element. The term "longitudinal deformation force," as used herein, refers to a longitudinal expansion or compression force applied to an element, e.g. vibratory beam, to cause a flexing of that element in a transverse direction. Further, a periodic deformation force can include an alternate series of expansion and compression forces, a series of expansion forces interleaved with periods of vanishing force, a series of compression forces interleaved with periods of vanishing force, or any combination of these applied forces.

With continuing reference to FIG. 1, the piezoelectric element 20, as a result of its mechanical coupling to the vibratory beam 12, applies a periodic longitudinal deformation force to the beam 12. Because the beam 12 is fixed at its two ends, the force applied by the piezoelectric element causes a periodic flexing of the beam in the transverse direction. That is, the input signal applied to the piezoelectric film 20 causes a transverse periodic vibratory motion of the beam 12.

In general, the transverse vibratory motion of the beam 12 induced by the piezoelectric element can include a number of frequency components, especially at even sub-multiples of the input frequency, i.e., f/2, f/4, etc. The beam parameters such as mass per unit length, tension, etc, can be selected such that the beam exhibits a natural vibrational resonance in the transverse direction at a frequency that is substantially equal to one of the sub-multiples of the input frequency. For example, in one embodiment, the beam is constructed so as to have a natural vibrational resonance frequency in the transverse direction that is approximately one-half of a selected input frequency. In such a case, the longitudinal force applied to the beam 12 by the piezoelectric transducer 20, in response to an oscillatory input signal at frequency (f), induces the beam 12 to vibrate coherently in the transverse direction at a frequency that is substantially equal to one half the input frequency, i.e. f/2.

A transverse vibratory motion of the beam 12 in turn modulates a capacitive coupling between the conductive electrode 24 and the vibratory beam 12, thereby inducing an electrical signal in the electrode 24 at the transverse vibrational frequency of the beam. An output lead 26 allows the pick-off of this oscillatory electrical signal. Thus, the device 10 functions as an analog frequency divider by receiving an input signal at a selected frequency and providing an output signal at a fraction, e.g. one-half, of the input signal frequency. In other words, the device 10 functions as an injection-locked parametric oscillator that is driven by an input signal at a selected frequency in a manner that a parameter of the resonator is varied so as to generate a coherent oscillation, at a fraction of the input frequency, as an output signal.

With continuing reference to FIG. 1, a DC voltage can be optionally applied to the conductive layer 22, for example, by a voltage source 28, to facilitate the capacitive coupling of the conductive layer 22, and consequently that of the vibratory beam, with the electrode 24, and to shield the electrode 24 from the input signal. The voltage applied to the conductive layer 22 can also be utilized to provide some degree of tuning of the transverse vibrational resonance frequency of the vibratory beam 12. In general, an analog frequency divider of the invention, such as the above exemplary divider structure 10, can be formed as a resonant oscillator that exhibits a resonance response curve having a peak and a width which is indicative of the Q factor of the resonator, typically of the order of a few hundred or more. The tuning voltage applied to the conductive layer 22 can be utilized to shift the peak of the resonant response curve of the divider. This allows adjusting the resonant frequency of the divider to compensate for manufacturing tolerances.

In one embodiment of the invention, the analog frequency divider structure 10 is implemented as a micro-electromechanical systems (MEMS) device by utilizing MEMS fabrication techniques, as described below. For example, FIGS. 3–10 schematically illustrate various exemplary fabrication steps utilized in one embodiment of the invention for generating the frequency divider structure 10 as a MEMS device.

Figure 3:
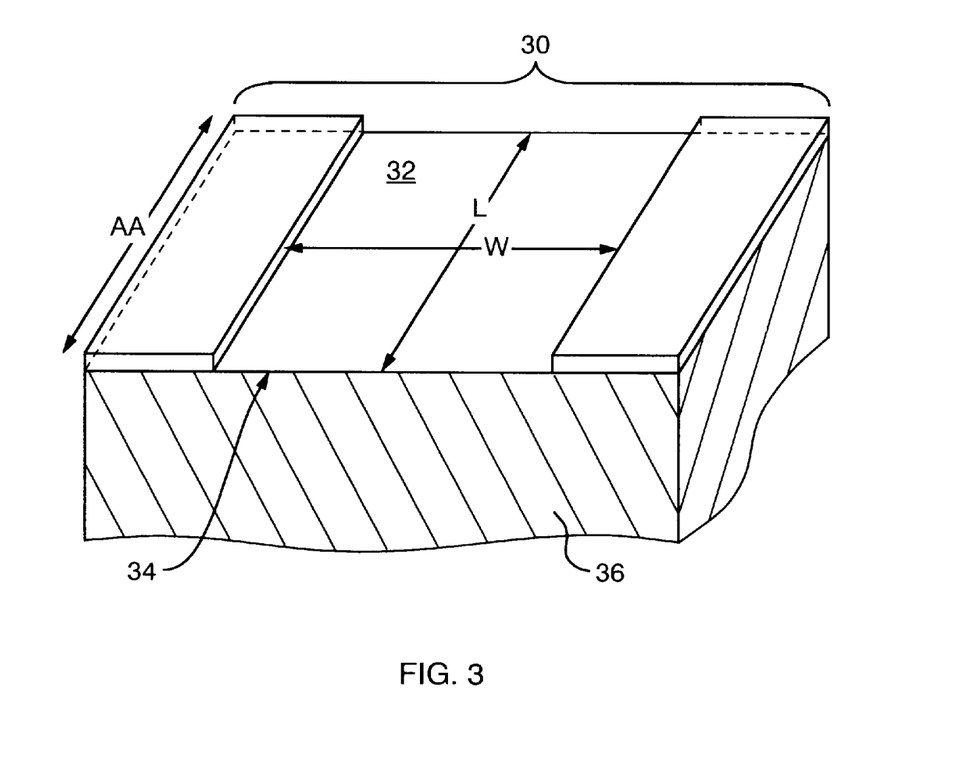
FIG. 3 is a perspective view of a substrate on which a patterned resist layer is deposited, in an initial step, in a method for manufacturing an analog frequency divider according to the teachings of the invention.

More particularly, as shown in FIG. 3, in an initial step, a patterned layer of a photoresist 30 having an opening 32 is formed on a top surface 34 of a silicon substrate 36. The patterned layer 30 can be formed by utilizing standard photolithographical techniques. For example, a positive photoresist, such as, phenyl formaldehyde or Novalac resin, can be deposited over the surface 34, and a portion of which that corresponds to the opening 32 can be exposed to an activating radiation via, for example, a mask. The exposed portion can then be removed to create the opening 32. The exemplary opening 32 has a rectangular shape with a length L, which is equal to the length of a beam to be generated in the substrate 36, and a width W, which is larger that a selected width of the beam.

Figure 4:
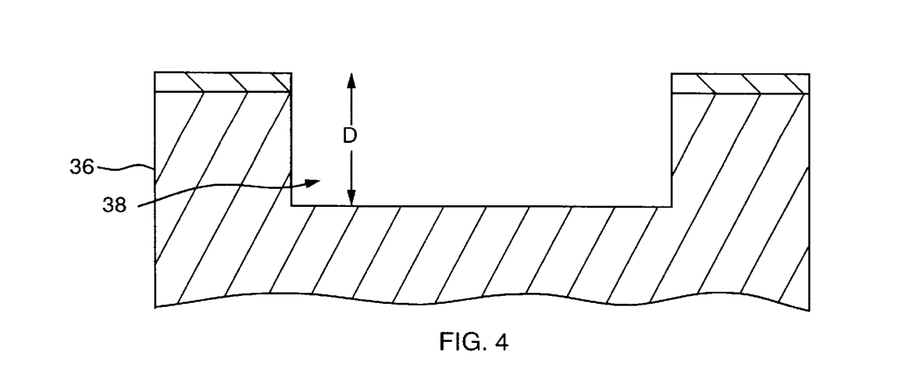
FIGS. 4–6 are cross-sectional views of the substrate of FIG. 3 along direction AA schematically illustrating a number of additional manufacturing steps for forming an analog frequency divider according to the teachings of the invention.

Referring to FIG. 4, which is a cross-sectional view of the substrate 36 along the AA direction, subsequent to the formation of the patterned layer 30, a trench 38 is etched in the opening 32 by utilizing, for example, a reactive ion etching (RIE) technique to which the photoresist layer present on the substrate surface 34 is resistarit. The trench 38 is sufficiently deep to accommodate subsequent layers to be deposited therein, as discussed below. For example, in one embodiment, a depth D of the trench 38 is selected to be approximately 1 micron.

Figure 5:
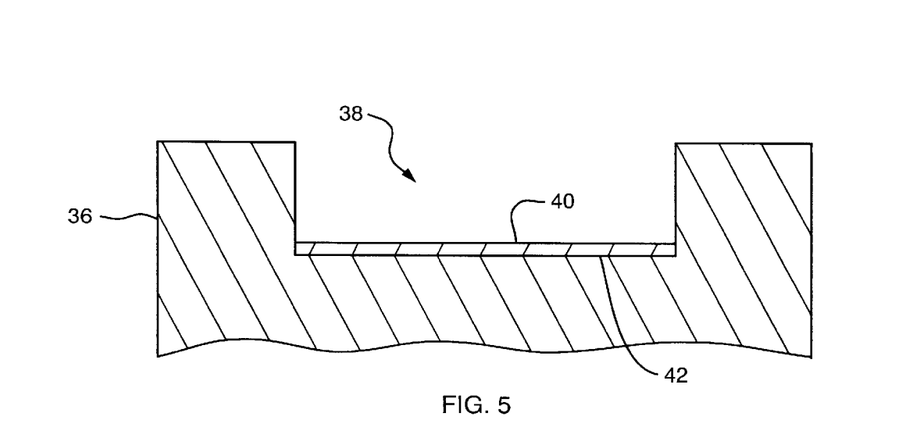

As shown schematically in FIG. 5, a thin layer of a low-temperature glass 40, such as, borosilicate glass, is then deposited on a bottom surface 42 of the trench 38. The deposition of the glass layer 40 can be accomplished, for example, by initially sputtering a low-temperature glass over the substrate to cover the photoresist portions and the bottom surface 42 of the trench 38. Subsequently, the photoresist portions, on which glass is deposited, are lifted off the top surface 34 of the silicon substrate 36 by utilizing standard techniques, thereby providing a layer of deposited glass 40 only on the bottom surface 42 of the trench 38. The substrate 36 is then heated at an elevated temperature, for example, at approximately 300° C., to cause the deposited glass to melt and form a smooth surface on which subsequent layers will be deposited, as described below.

Figure 6:
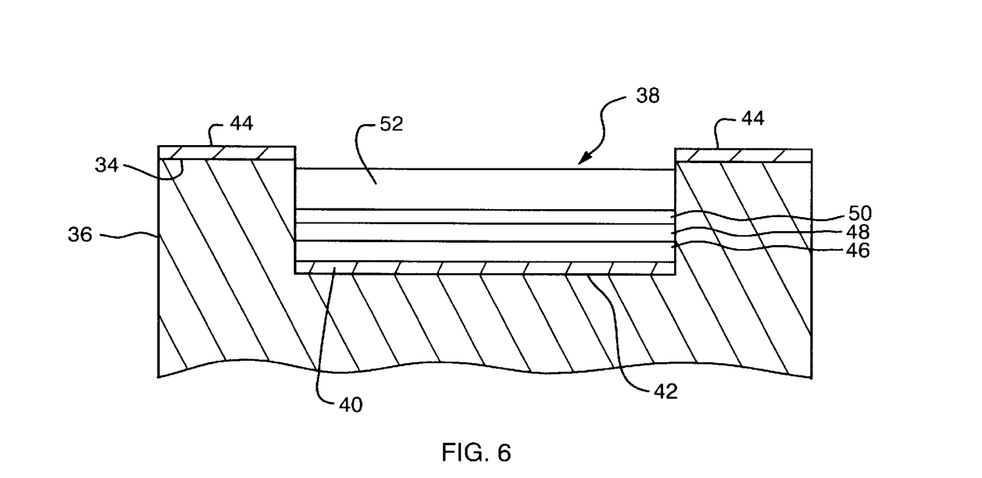

Subsequently, with reference to FIG. 6, a layer of a photoresist 44 is applied and patterned by utilizing known photolithographical techniques such that the resist covers only the area of the top surface 34 of the substrate 36 that surrounds the opening 32. Subsequently, a multi-layer structure is generated in the trench 38 over the glass layer 40 through deposition of various layers that will be processed into various components of the analog frequency divider 10 (FIG. 1) or will facilitate the fabrication process. For example, a metallic layer 46 can be formed, for example, of tungsten or chromium having a monolayer of palladium, by deposition over the glass layer 40. Further, a release layer 48 formed, for example, of diamond-like carbon (DLC) can be deposited over the metallic layer 46.

The next deposited layer 50 is a conductive layer that is formed, for example, of $Si_2Co$. Upon the conductive layer 50, an insulating layer 52 is deposited, which will form the vibrating beam 12 (FIG. 1) in subsequent processing steps. A variety of insulating materials, such as $Si_3N_4$, can be utilized to create the layer 52. Subsequent to the deposition of the above layers, the photoresist portion 44, and consequently the materials deposited thereon during the above deposition steps, are removed such that the deposited layers are confined to those present in the trench 38.

Figure 7A:
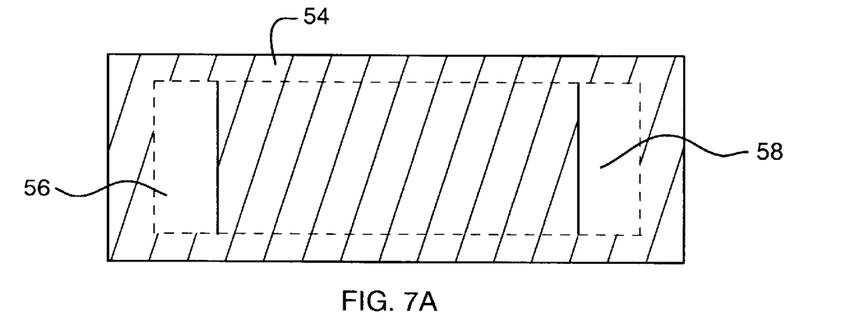
Figure 7B:
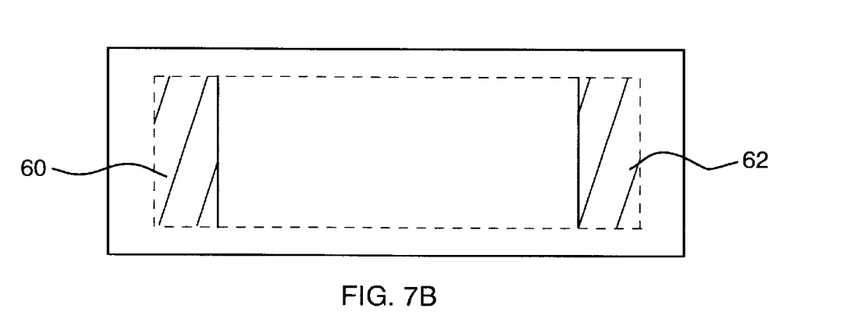

Following the formation of the multilayer structure in the trench 38, a piezoelectric film and two metallic electrodes for applying a voltage to the piezoelectric film are formed on the top surface of the layer 52 in a manner described below. The steps for fabricating the piezoelectric film and its corresponding electrodes can be perhaps better understood by reference to FIGS. 7A–7D, which present top views of the substrate 36 (FIG. 6) with the rectangular portion delineated by the dashed lines representing the trench 38. As shown in FIG. 7A, a patterned layer of a photoresist 54 having two openings 56 and 58, each positioned over a portion of the top surface of the layer 52, is deposited over the substrate. Subsequently, a layer of a metallic material, such as, platinum or tungsten, is deposited over the patterned resist and in the openings 56 and 58. A number of known techniques, such as, sputtering or chemical vapor deposition (CVD), can be utilized to deposit a metallic layer over the substrate surface. With reference to FIG. 7B, the removal of the photoresist layer 54, following the deposition of the metallic layer, leaves two metallic islands 60 and 62 in the openings 56 and 58, respectively, over the top surface of the layer 52. The metallic portions 60/62 can function as conductive electrodes for applying an electrical potential difference to a piezoelectric layer to be formed therebetween over the top surface of the layer 52, in a manner described below.

Figure 7C:
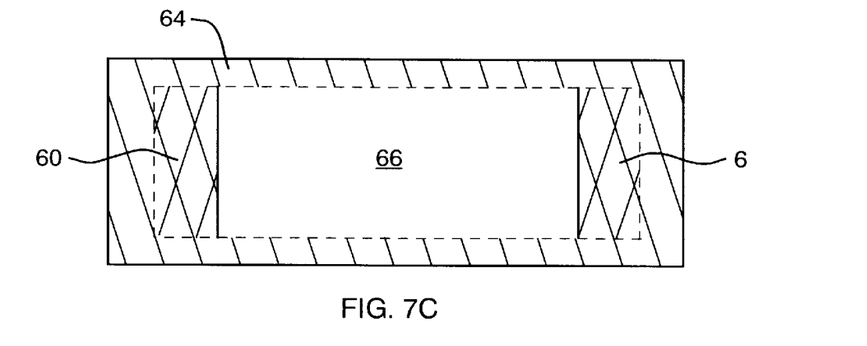
Figure 7D:
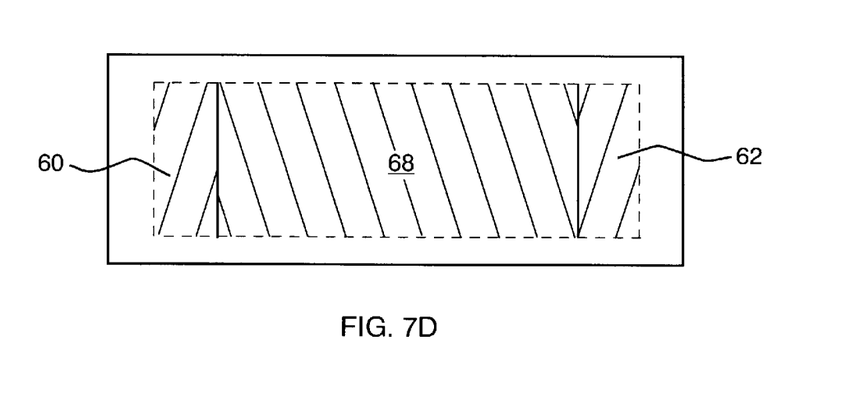

With reference to FIGS. 7C and 7D, following the formation of the metallic electrodes 60 and 62 and removal of the photoresist layer 54, another patterned layer 64 of a photoresist having an opening 66 between the metallic electrodes 60 and 62, is formed over the substrate surface. Subsequently, a film of a piezoelectric material is formed over the substrate surface followed by removal of the photoresist layer, thereby generating a piezoelectric film 68 sandwiched between the metallic electrodes 60 and 62, as shown in FIG. 7D. The piezoelectric materials that can be utilized for forming the film 68 include, but are not limited to, zinc oxide (ZnO), aluminum nitride (AlN), lead titanate ($PbTiO_3$), lead zirconate titanate. ($Pb(Zr,Ti)O_3$) and lithium niobate ($LiNbO_3$).

A variety of techniques can be employed to form the piezoelectric film 68. Such techniques can include, but are not limited to, sputtering, e.g., physical vapor deposition (PVD), chemical vapor deposition (CVD), or sol-gel methods, such as, spin coating. For example, U.S. Pat. No. 6,103,072, herein incorporated by reference, describes a process for generating a piezoelectric thin film by forming piezoelectric seed crystals on a substrate by utilizing, for example, PVD, CVD, or spin coating, and causing the crystals of a piezoelectric thin film to grow on the seed crystals by hydrothermal synthesis.

Figure 8:
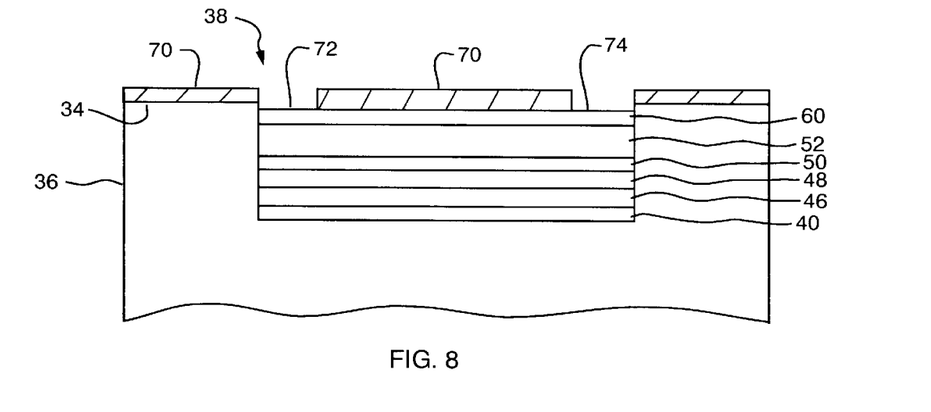

Referring to FIG. 8, in a subsequent step, a patterned layer 70 of a photoresist is formed over the substrate surface 34 and those layers deposited in the trench 38. The patterned layer 70 includes two openings 72 and 74 formed over the layers deposited in the trench 38. Each opening 72/74 exposes a portion of the top surface of the layers deposited in the trench 38 for further processing, as described below. In particular, as shown schematically in FIG. 9, two trenches 76 and 78 are formed in the multi-layer structure present in the trench 38 by utilizing, for example, reactive ion etching and/or wet-etching techniques. For example, wet-etching techniques can be employed to etch those layers, such as, a $Si_2CO$ conductive layer, for which RIE is not suitable. The trenches 76 and 78 extend from the top of the substrate surface to the glass layer 40.

Figure 9:
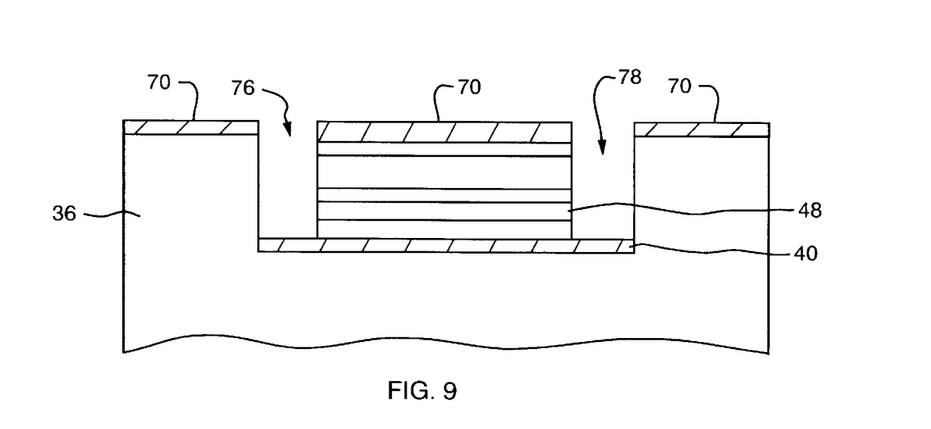
Figure 10:
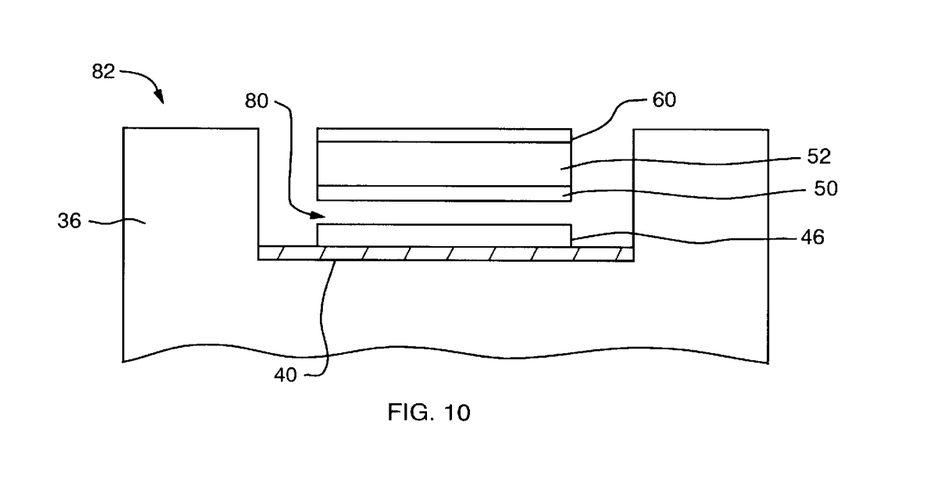

In a subsequent processing step, the release layer 48 is removed by application of a reactive ion plasma, such as, an oxygen plasma, to the structure of FIG. 9. More particularly, the ion plasma effects the conversion of the diamond-like carbon material forming the release layer 48 into carbon dioxide ($CO_2$), which sublimes to generate a gap 80 between the two layers 46 and 50. Further, the photoresist material 70 is removed to form a device structure 82, shown in FIG. 10. Upon formation of the gap 80, the layer 52 corresponds to the vibratory beam 12 of the analog device structure 10 (FIG. 1) having a longitudinal axis that extends in a direction perpendicular to the plane of the figure. Moreover, the layers 50 and 46 correspond to the conductive layer 22 and the electrode 24 of the analog frequency structure 10 (FIG. 1), respectively.

It should be understood that the above exemplary processing steps for forming a MEMS divider according to. the teachings of the invention are presented only as the steps of one illustrative manufacturing method, and are not intended to be construed as the only processing steps that can be utilized for forming a parametric divider in accordance with the teachings of the invention. In particular, various modifications to each of the above steps can be introduced and/or one or more manufacturing steps can be replaced with different steps. Further, advances in technology may result in different methods and approaches for generating MEMs parametric dividers according to the invention.

Figure 11:
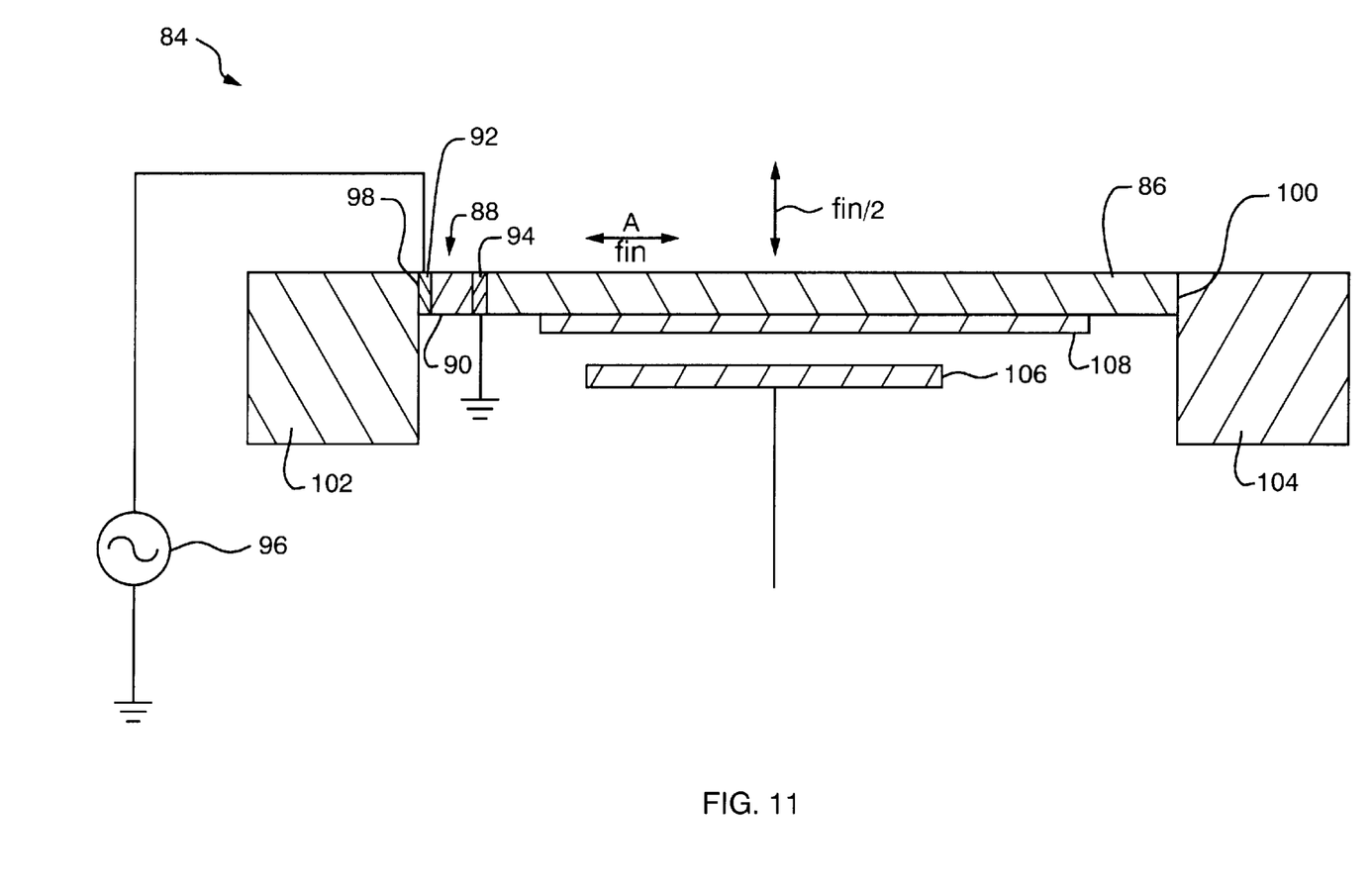

MEMS structures for implementing analog frequency dividers according to the teachings of the invention are not limited to the device 10 described above. For example, FIG. 11 schematically illustrates another MEMS analog frequency divider structure 84 according to the invention that functions as an injection locked parametric oscillator to generate an output signal at a sub-harmonic frequency of a driving input signal. The divider 84 includes a vibratory beam 86 attached to a piezoelectric transducer 88 along a longitudinal axis A. The transducer 88 includes a piezoelectric element 90, which is sandwiched between two electrodes 92 and 94 that allow applying a voltage thereto. More specifically, in this embodiment, the electrode 92 is coupled to an AC input voltage source 96 and the electrode 94 is grounded. The combination of the beam 86 and the piezoelectric transducer 88 is clamped at two ends 98 and 100 by two support elements 102 and 104, respectively. Moreover, a conductive electrode 106 is positioned in proximity of the beam 86 and is capacitvely coupled thereto. Further, a conductive layer 108, disposed over at least a portion of the beam 86, facilitates the capacitive coupling between the beam 86 and the electrode 106.

An oscillatory input voltage having a frequency (f), applied across the piezoelectric transducer 88, causes the application of a longitudinal deformation force to the beam 86, which in turn causes the beam to oscillate in a direction transverse to the longitudinal axis. As discussed above in connection with the previous embodiment, the beam 86 can be constructed so as to have a natural transverse vibrational frequency at or close to a sub-harmonic of the input driving frequency. For example, in one embodiment, the beam resonates in the transverse direction at one-half the input frequency (f). This facilitates the transverse vibration of the beam at a frequency of approximately f/2 in response to application of a longitudinal driving signal at a frequency f to the piezoelectric element. Similar to the previous embodiment, the conductive layer 106 capacitively couples to the transverse vibrational motion of the beam 86, thereby generating an electrical signal at the frequency of the transverse vibration.

Figure 12:
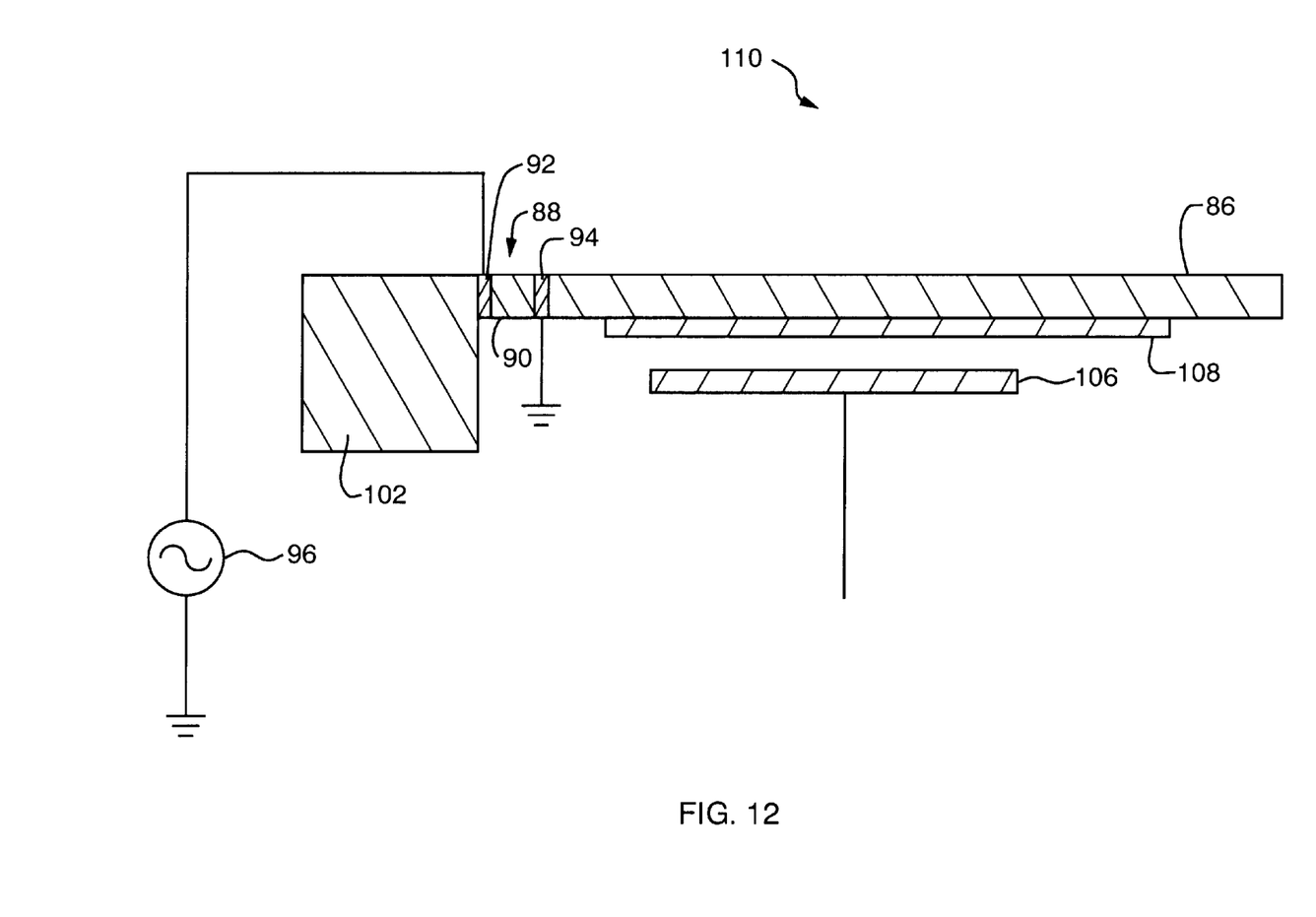

With reference to FIG. 12, another MEMS parametric frequency divider structure 110 according to the teachings of the invention includes a vibratory beam 86 that is clamped only at one end by a support element 102. A piezoelectric transducer 88, having a piezoelectric element 90 sandwiched between two electrodes 92/94, modulates the length of the vibratory beam in response to an input voltage at frequency (f) applied thereto by an AC voltage source 96. This modulation causes a coherent transverse vibration of the beam that in turn modulates a capacitive coupling between the beam and an electrode 106, thereby generating an output AC voltage at a sub-harmonic of the input voltage frequency. As in the frequency divider structure 84 of FIG. 11, a conductive layer 108 disposed on a surface of the vibratory beam 86 facilitates the capacitive coupling between the beam 86 and the electrode 106.

Those skilled in the art will appreciate that illustrative MEMS processing steps described above can be readily modified to obtain a manufacturing method for forming a MEMS divider according to the invention having a vibratory beam that is clamped at only one end thereof, such as the beam 86 of the above divider 110.

Figure 13:
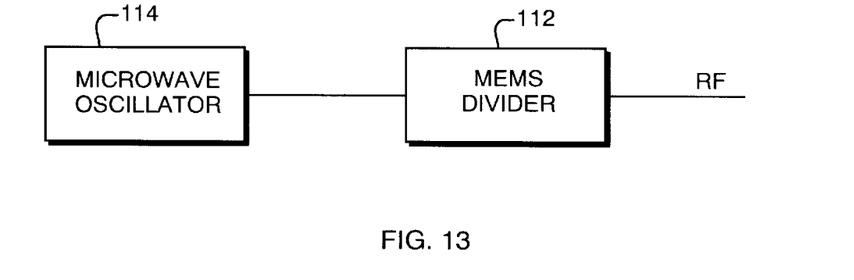

Parametric analog frequency dividers according to the invention can be constructed at any desired frequency. The dividers of the invention advantageously require low operating power, and can find a variety of applications such as communications systems (e.g., wireless communications systems) and miniature atomic clocks. For example, with reference to FIG. 13, a MEMS divider 112 having one or more MEMS divider structures according to the invention can be utilized to prescale the frequency of a microwave oscillator 114 from the microwave frequency range to an RF range, e.g. 10–100 MHz. The RF output of the MEMS divider can be utilized for a variety of applications, e.g. as a reference signal.

Figure 14A:
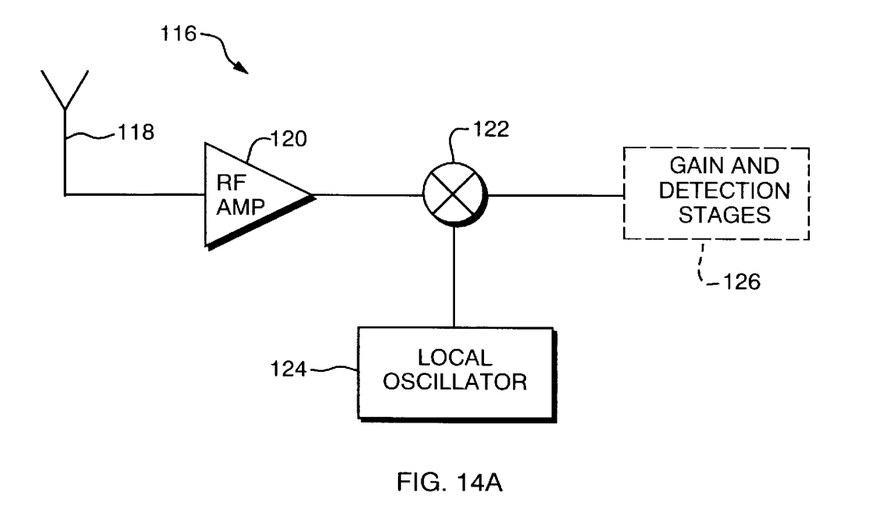
Figure 14B:
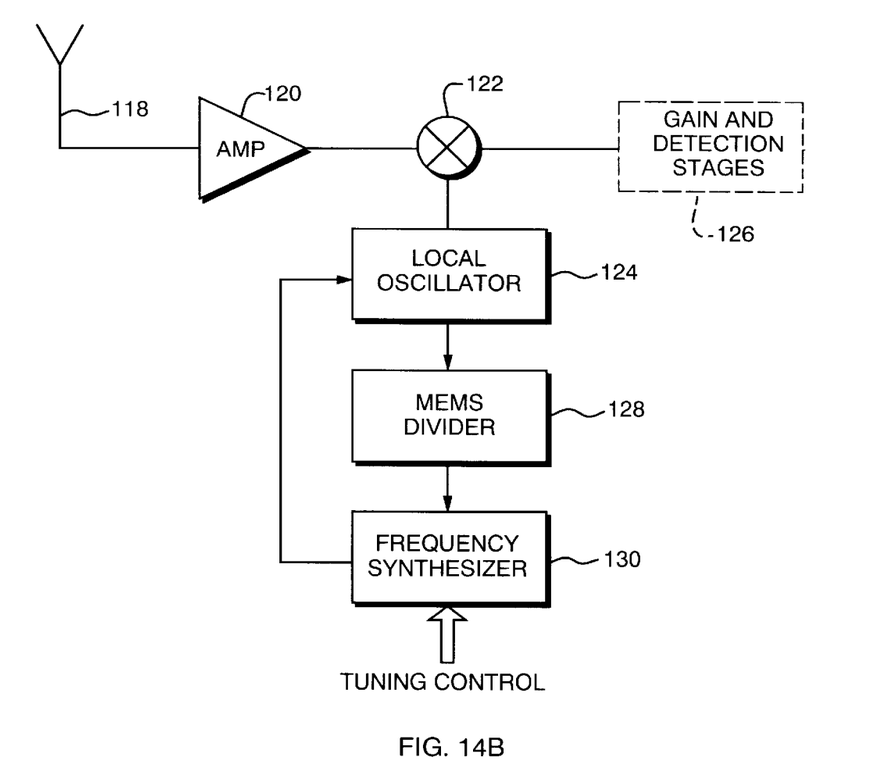

As mentioned above, analog frequency dividers according to the teachings of the invention can be utilized in radio systems, e.g. wireless communication systems. For example, FIG. 14A schematically illustrates a conventional radio receiver 116 that utilizes superheterodyne detection circuitry to down-convert the frequency of a radio signal received by an antenna 118, and amplified by an RF amplifier 120, from the megahertz (MHz) region to an intermediate frequency (IF) in the kilohertz (kHz) region. More particularly, a mixer 122 mixes the incoming signal with the output of a local oscillator 124 to generate a difference frequency signal that is amplified and detected by a subsequent gain and detection stage 126. The receiver 120 can be modified, as shown in FIG. 14B, to incorporate a MEMS divider 128 to prescale the output of the local oscillator 124. The output of the MEMS divider 128 is fed to a frequency synthesizer 130 as a feedback signal. The frequency synthesizer 130 applies a signal to the local oscillator in response to this feedback signal to ensure that the local oscillator frequency is maintained at a desired value.

Those skilled in the art will appreciate that a MEMS analog divider according to the invention can be utilized in radio receiver and transmitter systems in ways different than those shown in FIGS. 14A and 14B.

In another application, a chain of analog frequency dividers of the invention, each tuned to one half of the frequency of a previous member of the chain, can be utilized in a miniature atomic clock for frequency division from the microwave range to the RF range, e.g., 10–100 MHz, as discussed in more detail below.

A number of atomic clocks are known in the art. One class of atomic clocks utilizes an atomic transition, at a frequency of 9,192,631,770 Hz, arising from nuclear magnetic hyperfine structure in the ground state of cesium atom to provide an accurate frequency standard. Briefly, in one such system, a sample of cesium atoms, selected to be in a first energy state of the hyperfine split transition, are excited by radiation from a microwave source. The microwave excitation causes a fraction of the atoms in a first energy state to be excited to a second energy state of the transition. A servo loop having an analyzer determines the fraction of the cesium atoms that are excited to the second energy state and provides a feedback signal to the microwave source in order to tune the frequency of the microwave source to optimize the fraction of the atoms that make the transition.

Figure 15:
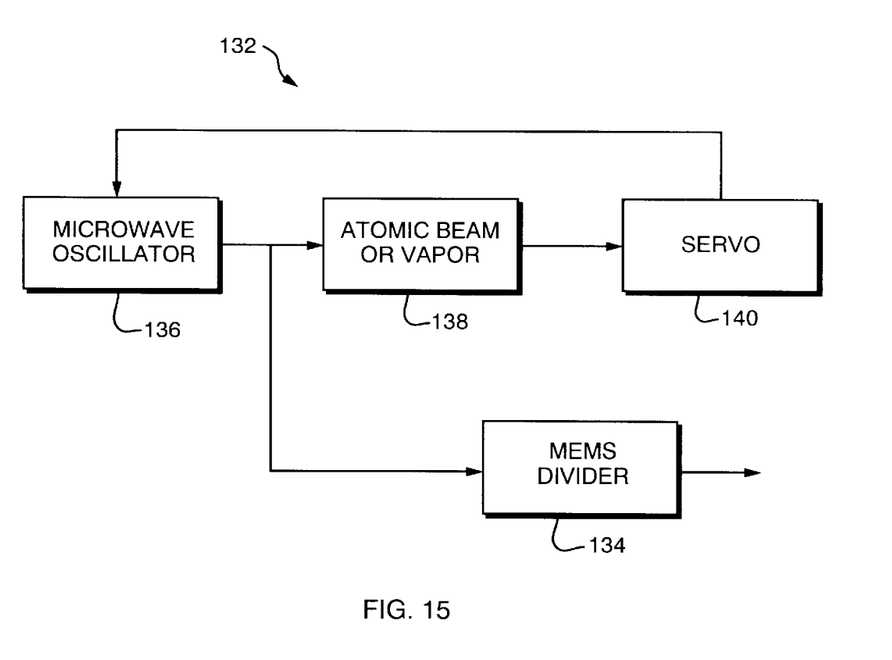
FIG. 15 is a diagram depicting an atomic clock system in which a MEMS divider according to the teachings of the invention is incorporated.

Analog frequency dividers according to the teachings of the invention can be utilized in an atomic clock system, such as those described above, to convert the stabilized frequency of a microwave oscillator, locked to an atomic transition, to a lower frequency range that is more suitable for subsequent utilization in timing systems. For example, FIG. 15 schematically illustrates basic components of an atomic clock system 132 in which a MEMS divider 134 in accordance with the teachings of the invention is incorporated. The atomic clock system 132 includes a microwave oscillator 136 that provides radiation for exciting an atomic resonance of a collection of atoms 138, and a servo system 140 that provides a feedback signal to the microwave oscillator in order to lock its frequency to the atomic transition. A portion of the stabilized output of the microwave oscillator 136 is directed to the MEMS divider 134, formed in accord with the teachings of the invention, to prescale the output frequency of the oscillator from the microwave range to the radiofrequency range. For example, in one embodiment, the divider generates an output signal having a frequency that is $\frac{1}{64}$ of the output frequency of the oscillator.

Figure 16:
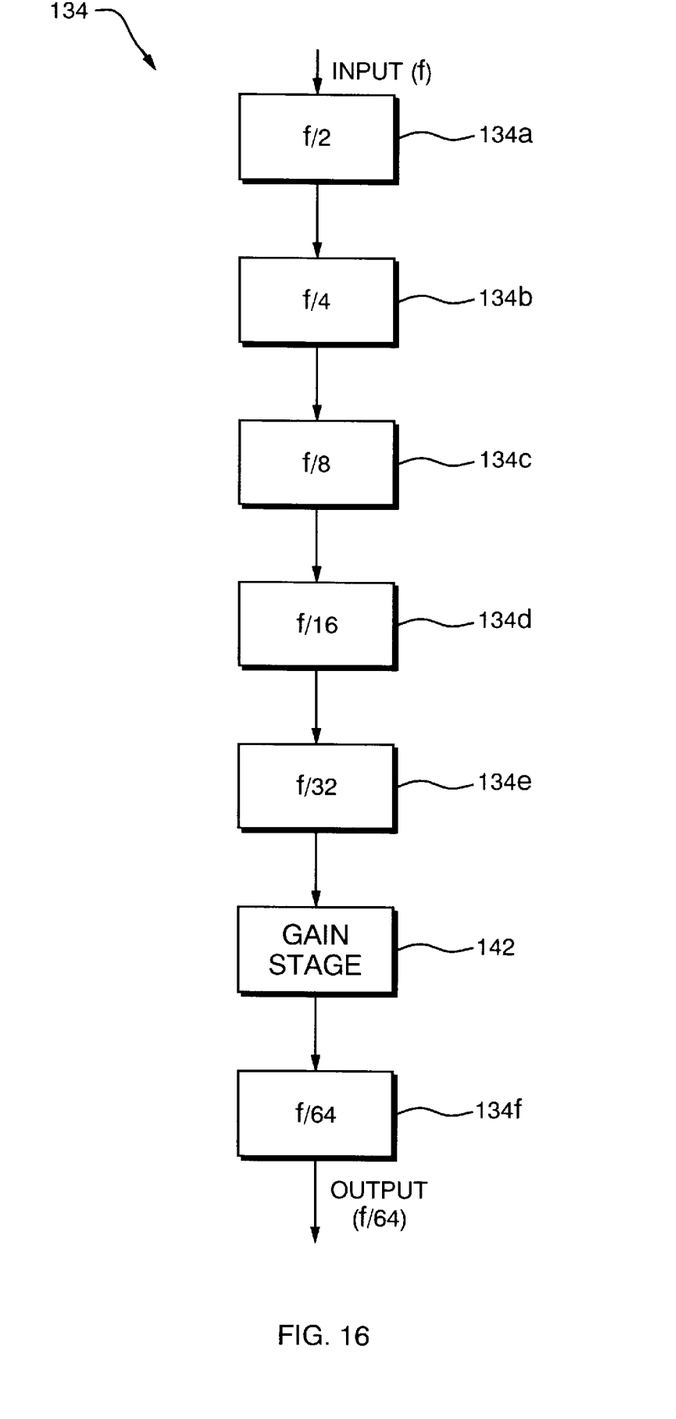
FIG. 16 is a diagram illustrating that the MEMS divider of the system of FIG. 15 includes a plurality of MEMS analog frequency dividers coupled to one another in a series arrangement.

FIG. 16 schematically illustrates one embodiment of the MEMS divider 134 that is formed as a series of six analog frequency divider structures 134a–134f, herein collectively referred to as divider structures 134, each of which divides the output frequency of the previous divider in the chain by a factor of two. One or more gain stages such as gain stage 142 can be employed between any two of the divider structures 134. For example, in one embodiment of the atomic clock system 132, cesium atoms are utilized, and the frequency of the microwave oscillator 136 is locked to one-half the hyperfine transition frequency of cesium atom in the ground state. In this embodiment, each of the analog frequency dividers 134 has the same structure as the exemplary divider 10 (FIG. 1), described above. Further, the output of the divider 134a, which includes a resonating beam that exhibits a natural transverse vibrational resonance at one-half the locked output frequency of the oscillator 136, is fed as an input into the divider 134b. The divider 134b has a resonator beam that is selected to have a natural transverse vibrational frequency that is one half the output signal of the divider 134a. That is, the output of the divider 134b has a frequency that is ¼ of the oscillator frequency. Similarly, each of the dividers 134c–134e is constructed to exhibit a natural transverse vibrational resonance at one-half the output frequency of a previous divider. In this manner, the chain of dividers generates an output signal at $\frac{1}{64}$ frequency of the input signal.

A MEMS divider, such as the divider 134, can be constructed to require low power for its operation, thereby rendering it particularly useful in applications when power consumption needs to be minimized.

Other embodiments and uses of the invention will be apparent to those skilled in the art from consideration of the specification and practice of the invention disclosed herein. For example, the use of analog frequency dividers are not limited to those described above. The specification and examples should be considered as exemplary only with the true scope and spirit of the invention indicated by the following claims.

What is claimed is:

1. An analog mechanical frequency divider structure, comprising:
   an elongate vibratory beam having a longitudinal axis and at least one fixed end,
   a piezoelectric transducer mechanically coupled to the vibratory element to periodically apply a longitudinal deformation force at a selected frequency to the vibratory element thereby inducing a periodic vibration therein in a direction transverse to the longitudinal axis at a frequency substantially equal to an even sub-multiple of the selected frequency, and a conductive electrode capacitively coupled to the transverse periodic vibration of the vibratory beam so as to generate an output signal at an even sub-multiple of the selected frequency.

2. The structure of claim 1, wherein the vibratory beam exhibits a natural vibrational resonance in the transverse direction at a frequency substantially equal to an even sub-multiple of the selected frequency.

3. The structure of claim 2, further comprising:

an electrically conductive layer disposed on at least a portion of the vibratory beam, and wherein the conductive electrode is positioned at proximity of the conductive layer to capacitively couple to the periodic transverse vibration of the beam thereby generating an oscillatory electrical signal at the transverse vibrational frequency.

4. The structure of claim 1, wherein the beam executes the transverse vibration at half the frequency of the longitudinal deformation force.

5. The structure of claim 1, wherein the piezoelectric transducer applies the longitudinal deformation force to the vibratory beam at a frequency in a range of about 100 MHz to about 10 GHz.

6. The structure of claim 1, wherein the piezoelectric transducer is configured for coupling to a voltage source applying an oscillatory voltage at a selected frequency thereto.

7. The structure of claim 1, wherein the beam includes two opposed surfaces facing one another along the transverse direction, and the piezoelectric transducer comprises a film covering at least a portion of one of the surfaces.

8. The structure of claim 7, wherein the electrically conductive layer covers at least a portion of the surface of the beam opposite the surface coupled to the piezoelectric film.

9. The structure of claim 1, wherein the structure is formed as a micro-electro-mechanical systems (MEMS) device.

10. The structure of claim 9, wherein the MEMS device is formed in an integrated circuit chip or wafer.

11. The structure of claim 10, wherein the beam is formed of an insulating material.

12. The structure of claim 11, wherein the insulating material comprises $Si_3N_4$.

13. The structure of claim 1, further comprising at least one support element coupled to one end of the vibratory beam to clamp that end.

14. The structure of claim 3, wherein the conductive layer comprises $Si_2Co$.

15. The structure of claim 13, wherein the support element is formed of silicon.

16. The structure of claim 1, wherein the vibratory beam comprises two fixed ends.

17. A MEMS analog frequency divider structure, comprising:

an elongate vibratory beam extending in a longitudinal axis between two clamped ends thereof, a piezoelectric transducer mechanically coupled to the beam and driven at a selected frequency to apply a longitudinal expansion force to the beam at that frequency thereby inducing a coherent vibration in a direction transverse to the longitudinal axis in the beam at a frequency substantially equal to an even sub-multiple of the selected frequency, a conductive layer covering at least a portion of the vibratory beam, and a conductive electrode positioned in proximity of the conductive layer to capacitively couple to the transverse vibration of the beam thereby generating an electrical signal at said even sub-multiple frequency.

18. The MEMS structure of claim 17, wherein the beam exhibits a natural transverse vibrational resonance at a frequency substantially equal to an even sub-multiple of the selected frequency.

19. The MEMS structure of claim 18, wherein the piezoelectric transducer applies a longitudinal deformation force to the vibratory beam at a frequency in a range of about 100 MHz to about 10 GHz.

20. A MEMS analog frequency divider, comprising at least two MEMS structures coupled to one another in series such that an output signal of one divider provides an input signal of the other divider, each divider receiving an input signal at a selected frequency and generating an output signal at a frequency equal to a fraction of the input frequency, each MEMS structure comprising an elongate vibratory beam having a longitudinal axis extending between two fixed ends, a piezoelectric transducer mechanically coupled to the vibratory element to periodically apply a longitudinal force at an input frequency to the vibratory element thereby inducing a vibration therein in a direction transverse to the longitudinal axis at an output frequency substantially equal to an even sub-multiple of the input frequency.

21. The MEMS frequency divider of claim 20, wherein the vibratory element of one of the MEMS structures exhibits a transverse vibrational resonance at a first frequency $f_1$ and the vibratory element of the other structure exhibits a transverse vibrational resonance at a second frequency $f_2$, wherein $f_2$ is substantially equal to one-half $f_1$.

* * * * *